(12) United States Patent
Schmidt et al.

(10) Patent No.: US 6,172,392 B1
(45) Date of Patent: Jan. 9, 2001

(54) BORON DOPED SILICON CAPACITOR PLATE

(75) Inventors: Christopher O. Schmidt, Sunnyvale; Sunil D. Mehta; Xiao-Yu Li, both of San Jose, all of CA (US)

(73) Assignee: Vantis Corporation, Sunnyvale, CA (US)

(*) Notice: Under 35 U.S.C. 154(b), the term of this patent shall be extended for 0 days.

(21) Appl. No.: 09/280,887

(22) Filed: Mar. 29, 1999

(51) Int. Cl.[7] .......................... H01L 29/788; H01L 29/76
(52) U.S. Cl. ............................................................ 257/315
(58) Field of Search ............................................... 257/315

(56) References Cited

U.S. PATENT DOCUMENTS

| | | |
|---|---|---|
| 4,715,014 | 12/1987 | Tuvell et al. . |
| 4,924,278 | 5/1990 | Logie . |
| 5,449,935 | * 9/1995 | Nakamura . |
| 5,457,652 | 10/1995 | Brahmbhatt . |
| 5,487,033 | 1/1996 | Keeney et al. . |
| 5,615,150 | 3/1997 | Lin et al. . |
| 5,615,152 | 3/1997 | Bergemont . |
| 5,646,901 | 7/1997 | Sharpe-Geisler et al. . |
| 5,742,542 | 4/1998 | Lin et al. . |
| 5,761,116 | 6/1998 | Li et al. . |
| 5,780,893 | * 7/1998 | Sugaya . |
| 5,801,414 | * 9/1998 | Shinmori . |
| 5,828,099 | * 10/1998 | Van Dore et al. . |

FOREIGN PATENT DOCUMENTS

| | | |
|---|---|---|
| 0 295 935 | 12/1988 | (EP) . |
| WO 96 21273 | 7/1996 | (WO) . |

* cited by examiner

*Primary Examiner*—Stephen D. Meier
(74) *Attorney, Agent, or Firm*—Fliesler, Dubb, Meyer & Lovejoy (57) ABSTRACT

A nonvolatile memory device utilizing a program junction region of a p-type impurity and oxide grown thereon. In one aspect, the device comprises a programming structure and a program junction separated from said programming structure by a field oxide region. A program junction oxide layer overlies said program junction region. A floating gate is provided over the oxide which covers said programming structure, said program junction oxide layer, and in some embodiments the gate oxide of a sense transistor.

37 Claims, 8 Drawing Sheets

BORON DOPED SILICON CAPACITOR PLATE

BACKGROUND OF THE INVENTION

1. Field of the Invention

The invention relates to nonvolatile memory, and particularly a nonvolatile memory array and cell structure.

2. Description of the Related Art

Non-volatile memory devices of the type commonly referred to in the art as EPROM, EEPROM, or Flash EEPROM serve a variety of purposes, and are hence provided in a variety of architectures and circuit structures. One common application of EEPROMs is in programmable logic devices.

Semiconductor processing technology has moved progressively toward defining smaller device features, characterized by the channel length of transistors in the so-called 0.18 and 0.13 micron processes. As feature sizes shrink, the conventional "stacked gate" EEPROM structure has given way to different cell designs and array architectures, all intended to increase density and reliability in the resulting circuit. In most cases, cell designers strive for designs which are reliable, scalable, cost effective to manufacture and able to operate at lower power, in order for manufacturers to compete in the semiconductor industry. EEPROM designers strive to reduce power requirements of devices by reducing program and erase voltage requirements.

Typically, in programmable logic EEPROM devices, in order to store a logical zero, electrons are injected onto the floating gate to provide a negative voltage on the floating gate thus increasing the control gate threshold voltage needed to turn on the transistor. Conversely, to store a logical one, electrons are removed from the floating gate thereby decreasing the threshold voltage.

One example of a commercially successful EEPROM structure for programmable logic applications is shown in U.S. Pat. No. 4,924,278 (hereinafter "the '278 patent"), issued to Stewart Logie on May 8, 1990 and assigned to the assignee of the present invention.

Figure 1:
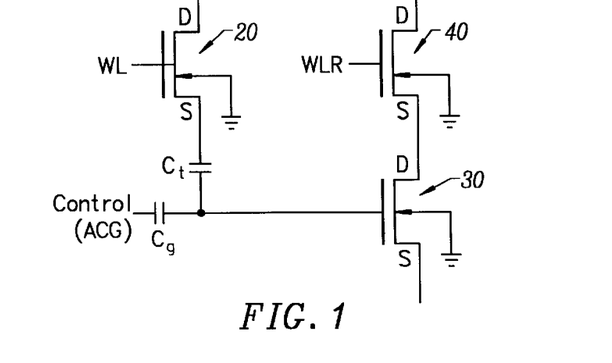
FIG. 1 is a schematic diagram of an EEPROM cell used in a programmable logic device.
Figure 2:
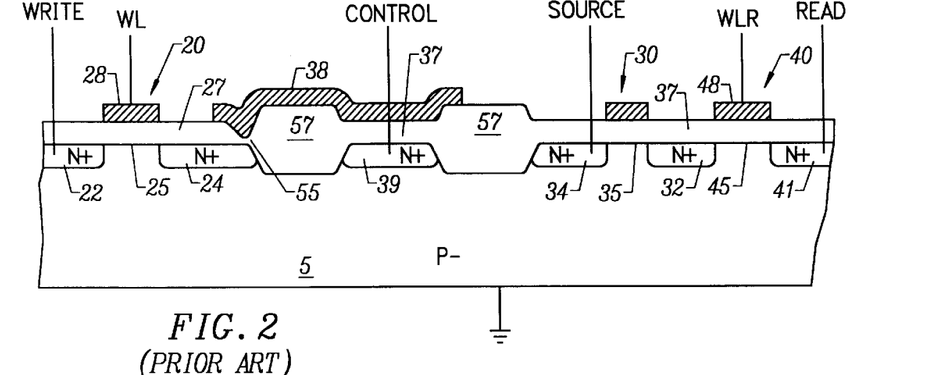
FIG. 2 is a semiconductor cross-section of the device shown in FIG. 1.

FIGS. 1 and 2 show a schematic diagram and a cross-section, respectively, of one embodiment of the EEPROM structure shown in the '278 patent. The EEPROM structure disclosed therein utilizes a single layer of polycrystalline silicon and a control gate formed in the silicon substrate to eliminate the need to form a separate control gate and floating gate in layers of polysilicon. The EEPROM structure is made up of three separate NMOS transistors: a write transistor, a read transistor, and a sense transistor. In order to "program" the floating gate, a net positive charge is placed on the gate by removing free electrons from the floating gate. Likewise, to erase the floating gate, the floating gate is given a net negative charge by injecting electrons onto the floating gate.

This EEPROM structure has been well exploited in commercial devices. Nevertheless, as process technologies and practical considerations drive designers toward higher performance, alternative designs are investigated. The aforementioned cell structure requires, in a number of embodiments, a minimum oxide thickness of about 85–100 Å for the program junction oxide region (between the control gate 39 and floating gate 38) due to the presence of the relatively high electric field across the oxide during the life of the cell. In order to accomplish scaling of the device, it would be desirable to provide a design wherein such region could be scaled without performance loss.

In addition, improvements in the quality of the program junction oxide can lead to operational advantages such as lower voltage operation and increased reliability of the device.

SUMMARY OF THE INVENTION

The invention, roughly described, comprises a nonvolatile memory device utilizing a program junction region of a p-type impurity, an oxide grown thereon, and a floating gate formed over said oxide. The device is formed on and in a semiconductor substrate, said semiconductor substrate having a first conductivity type. The program junction region is formed in said semiconductor substrate, and separated from a tunneling device, which might be built similar to a transistor, by a field oxide region. In a unique aspect of the invention, the program junction region is formed of said first conductivity type. A program junction oxide layer overlies said program junction region. Optionally, a sense transistor separated from the program junction by a field oxide region, and a read transistor may be provided. The floating gate overlies said tunnel oxide layer, said program junction oxide layer and said sense transistor.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

In accordance with the present invention, an improved EEPROM cell having a program junction formed of a p-type conductivity is provided. The invention finds an advantageous use in memory cell applications such as programmable logic devices.

Several embodiments of the invention are described herein. As will be understood from a review of the specification, numerous variations on these embodiments still falling withing the scope of the invention are possible.

FIGS. 1 and 2 show one embodiment of the EEPROM cell described in the '278 patent. FIG. 1 is a schematic diagram of the cell, while FIG. 2 is a semiconductor cross-section of the cell. As shown in FIG. 2, a P-type substrate 5 has six N+ type regions formed on and below its surface by standard diffusion techniques. Five of these N+ type regions correspond to the source and drain regions of the three transistors which make up the EEPROM memory circuit and are all formed with the same doping set. Write transistor 20 comprises drain 22, source 24, channel region 25, gate oxide layer 27 and control gate 28. Sense transistor 30 comprises drain 32, source 34, channel region 35, gate oxide layer 37, and N type polycrystalline silicon (poly-Si) floating gate 38. Read transistor 40 comprises drain 41, source 32, which is also the drain of sense transistor 30, channel region 45, gate oxide layer 47, and control gate 48. Poly-Si floating gate 38 is caoacitively coupled to source 34 of sense transistor 30, via gate oxide layer 37 (approximately 75–90 Å in thickness), and capacitively coupled to source 24 of write transistor 20 via tunnel oxide layer 55 (approximately 85–100 Å in thickness). Poly-Si floating gate 38 also extends over chanrel region 35 of sense transistor 30 so that when a sufficient positive charge is on poly-Si floating gate 38, channel 35 will invert and conduct current between source 34 and drain 32 of sense transistor 30. Field oxide layer 57 insulates floating gate 38 from the underlying substrate 5 separating sense transistor 30 and write transistor 20. A control gate 39 is provide by a separate N+ diffusion region which capacitively couples voltage to floating gate 38. Gate oxide layer 37 insulates control gate 39 from floating gate 38.

Operation of the memory cell 10 will be described with reference to FIGS. 1 and 2. In FIG. 1 word lines WL and WLR are connected to gates 28 and 48 of write transistor 20 and read transistor 40, respectively. Tunnel oxide layer 55 is represented by capacitor $C_t$ while program junction oxide layer 37 between control gate 39 and floating gate 38 is represented by capacitor $C_g$, Drain ano source contacts are represented by D and S, respectively.

The three operations of the memory circuit are write, erase, and read. The various voltages applied to the circuit of FIGS. 1 and 2 during each operation are shown in Table 1.

TABLE 1

| | WL | Write | Read | Source | Substrate | Control | WLR |
|---|---|---|---|---|---|---|---|
| Read | $V_{cc}$ | ground | $V_{sense}$ | ground | ground | ground | $V_{cc}$ |
| Program | $V_{pp}$ | $V_{pp}$ | HiZ | ground | ground | ground | ground |
| Erase | $V_{pp}$ | ground | HiZ | $V_{pp}$ | ground | $V_{pp}$ | $V_{cc}$ |

When floating gate 38 is written upon, or programmed, floating gate 38 is given a net positive charge by removing free electrons from floating gate 38. Since source 24 of write transistor 20 is at a high voltage and control gate 39 is grounded, voltage is capacitively coupled to poly-Si floating gate 38 due to the electric field created between source 24 and control gate 39 through gate oxide layer 37 and tunnel oxide layer 55.

To erase floating gate 38, high Programming voltage $V_{pp}$ is applied to word line WL as well as control gate 39 and source 34 of sense transistor 30, while drain 22 of write transistor 20 and substrate 5 are grounded. In this biasing arrangement, the high voltage at source 34 of sense transistor 30 is capacitively coupled to floating gate 38 and almost all of high programming voltage $V_{pp}$ appears across tunnel oxide layer 55 between floating gate 38 and grounded source 24. This causes electrons from source 24 to tunnel through tunnel oxide layer 55, resulting in a net negative charge on floating gate 38.

When reading the state of sense transistor 30, operating voltage $V_{cc}$, which is less than programming voltage $V_{pp}$, is applied to word line WLR, and voltage $V_{sense}$ is applied to drain 41 of read transistor 40. Drain 22 of write transistor 20, as well as control gate 39 and substrate 5, are grounded. A current flows between drain 41 and source 34 if sense transistor 30 is on, indicating a logical 1. If sense transistor 30 is off, current does not flow, indicating a logical 0.

Since sense transistor 30 and read transistor 40 are not subject to high voltage $V_{pp}$ between their source and drain regions, their channel lengths may be made short to increase reading speed.

Figure 3:
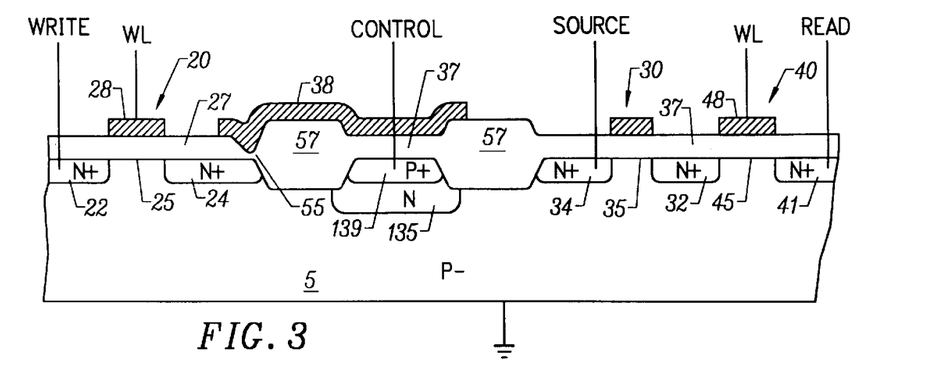
FIG. 3 is a semiconductor cross-section of the device of the present invention.

FIG. 3 shows a first embodiment of the present invention wherein the control gate region 139 is formed of a P+ region in a well in the P– substrate, rather than an N+ region as shown in FIG. 2. In the embodiment shown in FIG. 3, an N well 135 is formed in the substrate prior to formation of the P+ diffusion region 139 which serves as the control gate for the device 100. This allows isolation of the control gate 139 between field oxide regions 57.

It will be readily understood by one of average skill in the art that formation of the N well 135 would generally occur by depositing an impurity such as phosphorous or arsenic into substrate 10. Region 135 can be formed by direct implantation of the impurity into substrate 10, and/or by diffusion of a shallowly-implanted impurity to diffuse the impurity into substrate 10.

The P+ control region 139 may be formed by an implant of an impurity such as boron into substrate 10 to the desired depth below the surface of the substrate, while portions of the substrate overlying transistors 20, 30 and 40 are masked using appropriate masking techniques. Alternately, the P+ control region 139 may be formed without N-well 135 in the case where the substrate 5 is N type and the transistor source and drain regions 22,24,34,32,41 are also P+.

Formation of the control region 139 as a P+ region rather than an N+ region as set forth in the prior art provides a number of unique advantages over the conventional approach. In particular, improving the quality of the surface of region 139 (the program junction diffusion) improves the quality of the oxide grown thereon. The nature of the doping of boron for junction 139 is in the range of $10^{18}$ cm$^{-2}$ to $10^{20}$ cm$^{-2}$, and the smaller size of the boron atom means less damage to the program junction surface.

The program junction oxide 137 is generally formed after formation of the program junction 139 by heating the substrate in an oxygen-containing atmosphere and growing $SiO_2$ to a thickness of about 75 Å. Notably, the oxide 137 may be thinner than that of the prior art when region 139 has less damage during and after oxidation.

In the prior art, heavy phosphorous doping followed by subsequent growth of the capacitor oxide may, in some cases, cause silicon defects which can result in a lower quality oxide in the growth process. One side effect of this process is that phosphorous piles up at the surfaces of the substrate during oxidation. Utilizing boron doping for the program junction results in fewer defects in the silicon Fewer defects in silicon result in fewer defects, such as dangling bonds. in the oxide grown on that silicon, which allows a higher field to be placed across that oxide without causing damage. An increase in field allows a decrease in oxide thickness at a given $V_{pp}$ and therefore the size of the program junction capacitor may be smaller for a given coupling capacitance. Furthermore, when a positive voltage is applied to the control gate as in erasing, the P+ region will remain in accumulation and reduce the voltage drop in the silicon, allowing a lower program voltage to be utilized in the device. Hence, area scaling, lower voltage operation, and improved oxide quality can result when a P dopant is used for the program junction diffusion.

Figure 4:
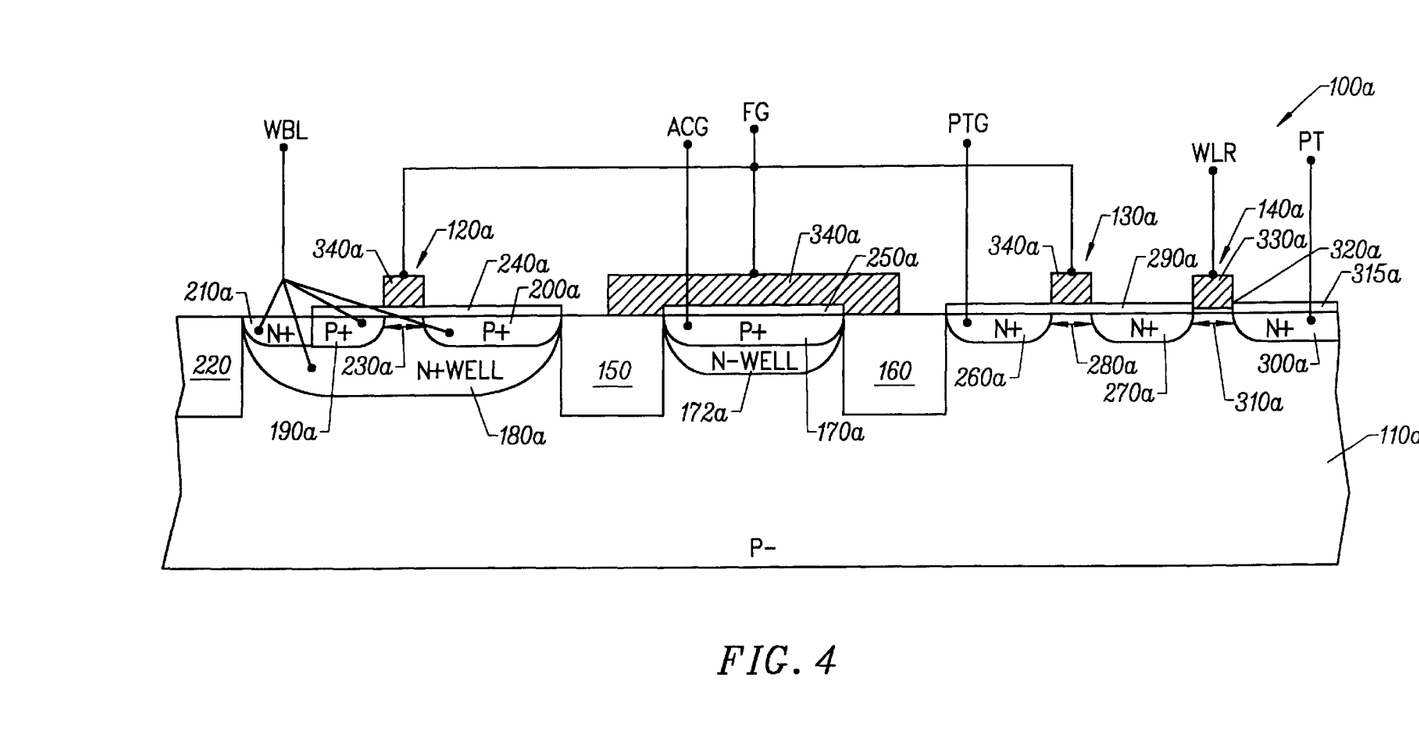
FIGS. 4–6 are semiconductor cross-sections of additional embodiments of tunneling structure EEPROM cells constructed in accordance with the present invention.
Figure 5:
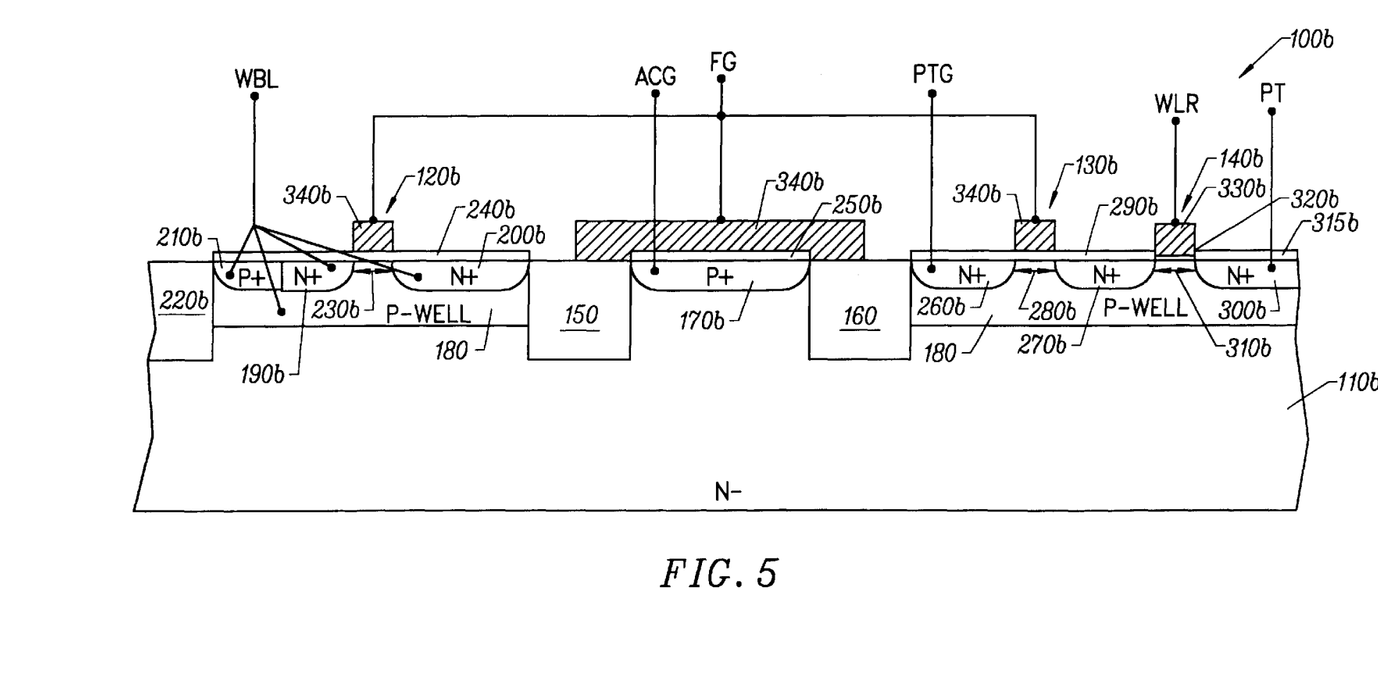

FIGS. 4 and 5 shows a second and third embodiment of the present invention, wherein alternative methods for programming and alternative EEPROM structures are utilized in accordance with the present invention.

Shown in FIG. 4 is an EEPROM cell which is programmed and erased by electron tunneling across an entire portion of separate transistor channels instead of only across an edge of a region as in previous EEPROM cells. The EEPROM cell has three transistors formed in a semiconductor substrate: a PMOS tunneling transistor 120a, a sense transistor 130a and a read transistor 140a.

In accordance with the present invention, the program junction (or ACG region) 170a is formed of a p+ impurity region in an n-well 172a. Accordingly, the advantages set forth above with respect to the embodiment of the invention shown in FIG. 3 can likewise be provided in the cell shown in FIG. 4. The cell of FIG. 4 provides electron tunneling through the sense tunnel oxide layer overlying the sense channel to occur across the entire portion of the sense channel which in concert with the p+ program junction further increases the overall reliability of the cell. (A similar cell structure, utilizing an n-type program junction region is disclosed in co-pending U.S. patent application Ser. No. 09/203,149, inventors Xiao-Yu Li and Steven J. Fong, filed Dec. 1, 1998 and hereby incorporated fully by reference.)

In the device shown in FIG. 4, the tunneling transistor 120a has a tunneling source 190a and a tunneling drain 200a, all formed within a well 180a. The well 180a has a second conductivity type opposite the first conductivity type, such as an N+ conductivity type. In contrast, the tunneling source 190a and tunneling drain 200a have the first conductivity type, e.g. a P-type conductivity. The tunneling transistor 120a is therefore a PMOS transistor in this embodiment. By using a PMOS transistor, the entire tunneling channel 230a may be used to perform electron tunneling as described below. This is because the well 180a, in addition to the tunneling source 190a and tunneling drain 200a, may be electrically coupled together to allow the entire tunneling channel 230a to be used for electron tunneling. An N+ region 210a is also located in well 180a to provide appropriate electrical contact to metal lines in the EEPROM cell 100a, such as word bit line (WBL).

The EEPROM cell of FIG. 4 further allows erasing across the tunneling channel and programming across the sense channel, to thereby separate the program and erase operations. By tunneling across a channel, the reliability of the EEPROM cell is increased since a larger oxide is used for programing and erasing operations, and reliability of the EEPROM device increases since the entire oxide layer is used rather than only an edge of an oxide layer. Reliability may be performed over separate regions, tunnel channel 230a and sense channel 280a, rather than the same tunneling window as previously used to perform both program and erase operations.

Yet another variation of the invention is shown in FIG. 5. As shown therein, an EEPROM cell is described that is programmed and erased by electron tunneling across an entire portion of separate transistor channels, rather than at an edge of a transistor region, by using a P conductivity type well for the tunneling, sense and read transistors. The tunneling source and the tunneling drain have the N conductivity type. (A similar cell structure, utilizing an n-type program junction region is disclosed in co-pending U.S. patent application Ser. No. 09/217,647, inventors Sunil D. Mehta and Xiao-Yu Li, filed Dec. 21, 1998 and hereby incorporated fully by reference.)

Between the tunneling transistor and the sense transistor is a program junction region 170b, formed in the n-type substrate in accordance with this embodiment of the present invention. The program junction 170b is separated from the tunneling transistor 120b by a first insulation region 150 and separated from the sense transistor by a second insulation region 160. The program junction region 170b, having an P conductivity type, also has a program junction oxide layer having the advantages described above, overlying the program junction region.

Figure 6:
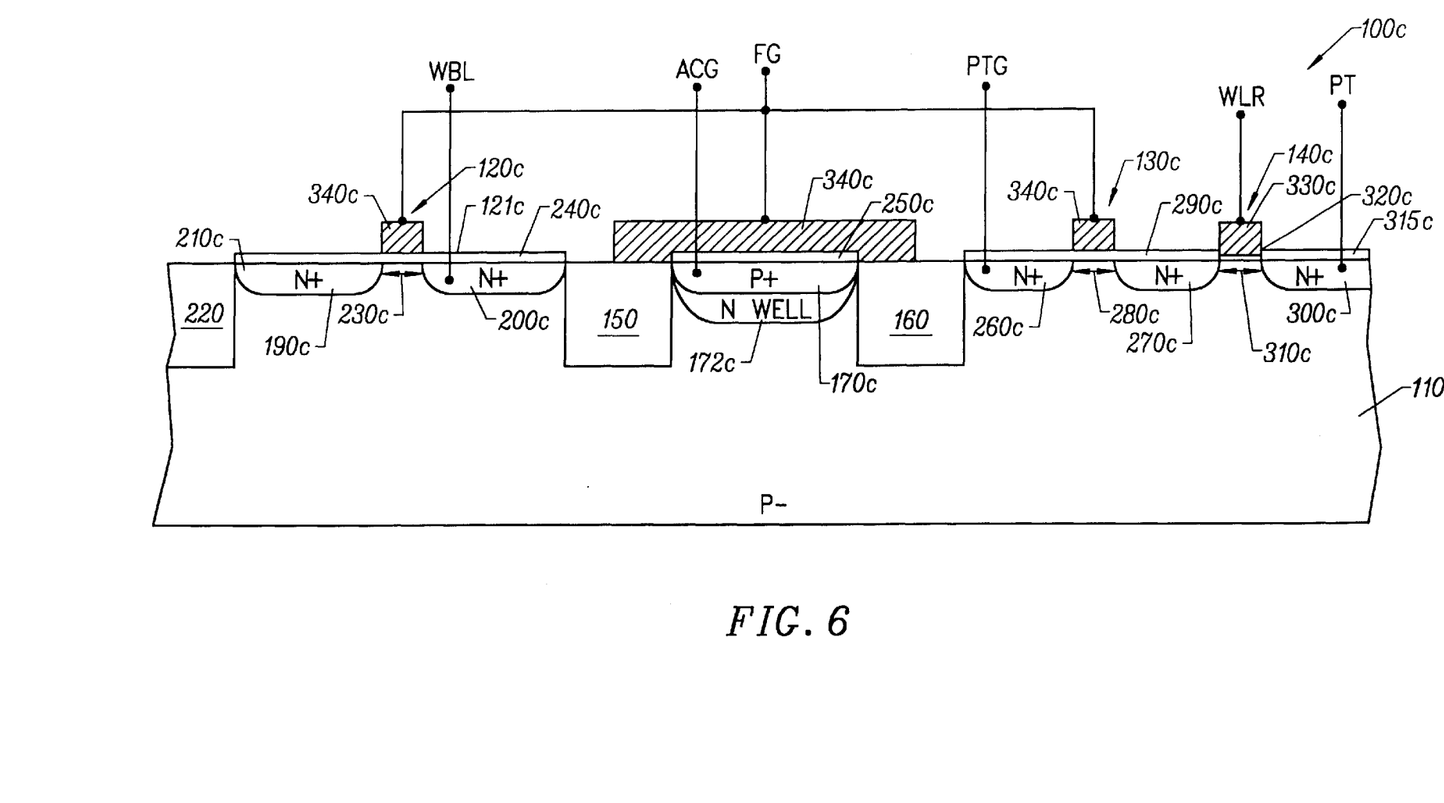

A still further embodiment of the cell of the present invention, similar to the above embodiments is shown in FIG. 6. The EEPROM cell 100c is programmed and erased by electron tunneling at separate transistor regions, namely at an edge of a tunneling transistor drain and a sense transistor channel using an N-MOS transistor 120c as the tunneling device.

In accordance with the invention the program junction region 170c has a p-type conductivity and is formed in an n-type well 172c in the substrate. This provides the cell 100c with the advantages of an improved quality of program junction oxide, a reduction of silicon defects at the junction region and a decrease in the oxide thickness for a given $V_{pp}$. (A similar cell structure, utilizing an n-type program junction region is disclosed in co-pending U.S. patent application Ser. No. 09/218,987, inventors Xiao-Yu Li and Steven J. Fong, filed Dec. 22, 1998 and hereby incorporated fully by reference.)

The EEPROM cell 100c provides electron tunneling through the sense tunnel oxide layer overlying the sense channel to occur across the entire portion of the sense channel and further allows erasing at the edge of the tunneling drain and programming across the sense channel to thereby separate the program and erase operations and thereby increase the EEPROM cell reliability. The EEPROM cell further has reduced thicknesses for the tunnel oxide layer, the program junction oxide layer, the sense tunnel oxide layer and the read gate oxide layer to improve scaleablity and reduce operating voltages of the EEPROM cell of the present invention.

Figure 7:
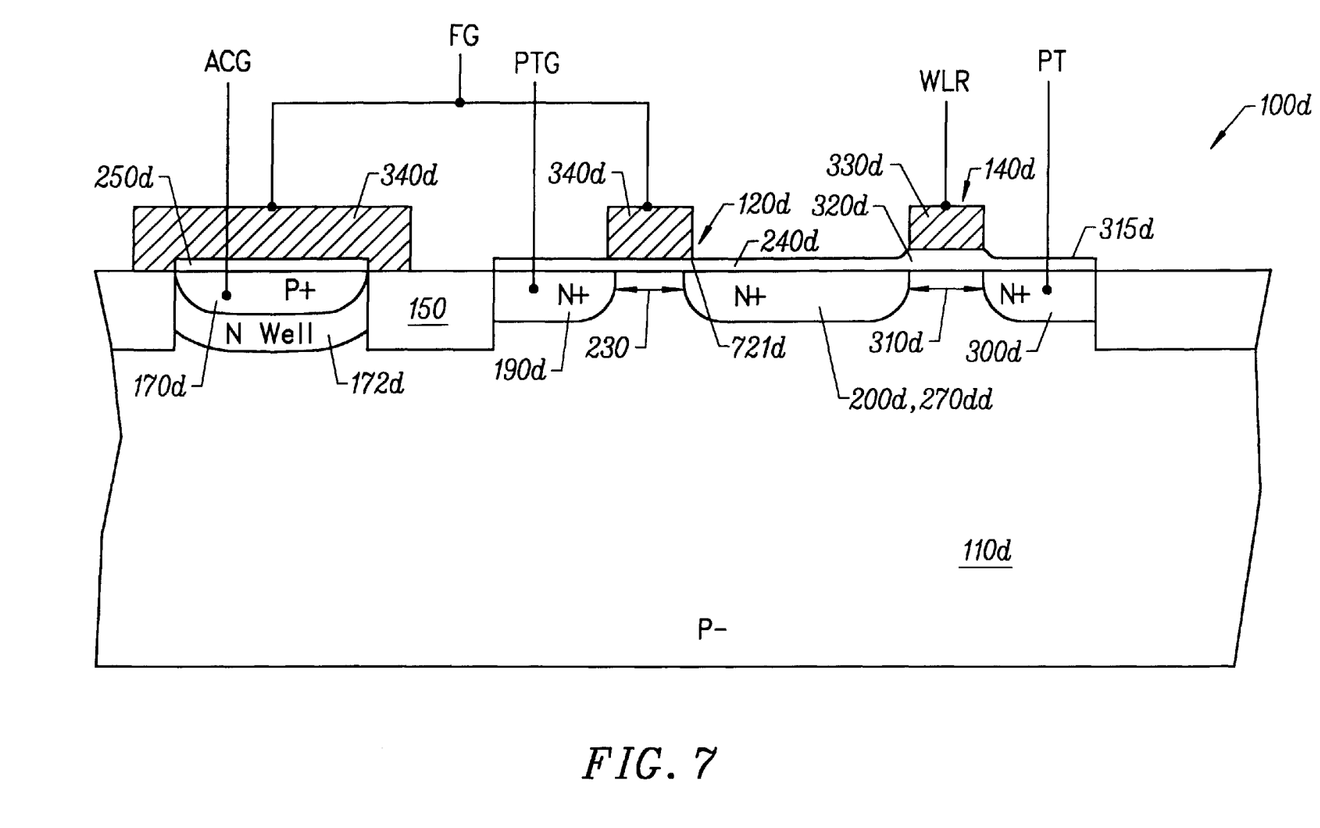
FIGS. 7–8 are semiconductor cross-sections of additional embodiments of two transistor tunneling structure EEPROM cells constructed in accordance with the present invention
Figure 8:
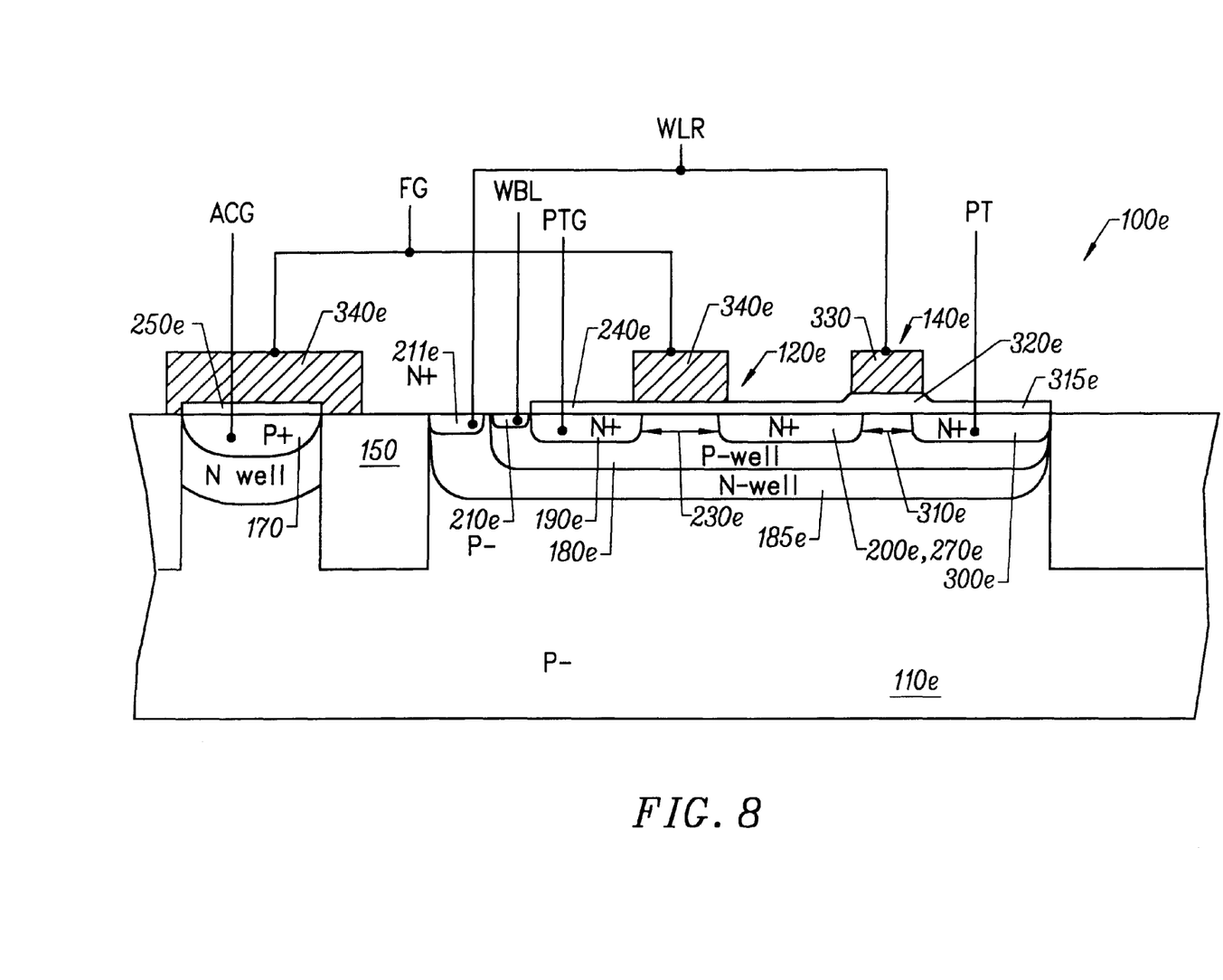

In FIGS. 7 and 8, a still further embodiment of the EEPROM device formed in accordance with present invention is provided. FIGS. 7 and 8 show a variation of two transistor EEPROM cells.

In FIG. 7, the cell 100a is erased by electron tunneling across an entire portion of a tunneling channel 230d and programmed by electron tunneling at an edge of a tunneling drain 190d. The EEPROM cell has two transistors formed in a semiconductor substrate 110: a tunneling transistor 120d and a read transistor 140d. The tunneling transistor 120d has a tunneling source 200d, a tunneling drain 190d, and a tunneling channel 230d between the tunneling source 200d and the tunneling drain 190d. The tunneling source and the tunneling drain have an n-type that is opposite the p-type conductivity of the semiconductor substrate. A tunnel oxide layer 240 is formed over the tunneling channel, the tunneling source and the tunneling drain.

Once again, in accordance with the present invention, the program junction 170d is formed of a P+region 170d in an n well 172d, and the program junction oxide 250d overlying the program junction 170d is formed as described above and includes the advantages of an oxide so formed. (A similar cell structure, utilizing an n-type program junction region is disclosed in co-pending U.S. patent application Ser. No. 09/245,813, inventors Steven J. Fong and Xiao-Yu Li, filed Feb. 5, 1999 and hereby incorporated fully by reference.)

Electron tunneling occurs through the tunnel oxide layer overlying an edge of the tunneling drain upon incurrence of a sufficient voltage potential between the floating gate and the tunneling drain to program the EEPROM cell. Electron tunneling also occurs through the tunnel oxide layer overlying the tunneling channel upon incurrence of a sufficient voltage potential between the floating gate and the tunneling channel to erase the EEPROM cell.

The two transistor EEPROM cell 100d is smaller than the previous three transistor cells and provides electron tunneling through the tunnel oxide layer overlying the tunneling channel to occur across the entire portion of the tunneling channel to erase the EEPROM cell, thereby increasing the EEPROM cell reliability. Also, the EEPROM cell is programmed by electron tunneling through the tunnel oxide layer overlying an edge of the tunneling drain, while the erase operation is performed across a tunnel channel. Thus, the programming and erasing operations are separated across different regions (edge of the tunneling drain and the entire tunneling channel) which increases the EEPROM cell's reliability In FIG. 8, the tunneling transistor 120e is formed in a second well (a P-well) 180 within a first well 185 (N-well) in the semiconductor substrate 110e; and a read transistor 140e also formed within the semiconductor substrate 110e. The read transistor 140e, also formed in the well 180, is electrically connected to the tunneling transistor through the tunneling drain 200, 270. Once again, the program junction is formed of an p+ region in an n-well. (A similar cell structure, utilizing an n-type program junction region is disclosed in co-pending U.S. patent application Ser. No. 09/239,072, inventors Sunil D. Mehta and Xiao-Yu Li, filed Jan. 27, 1999 and hereby incorporated fully by reference.) A floating gate FG overlies the tunnel oxide layer and the program junction oxide layer 250.

Electron tunneling occurs through the tunnel oxide layer upon incurrence of a sufficient voltage potent al between the floating gate and the tunneling channel to both program and erase the EEPROM cell. Again, this embodiment of the invention provides electron tunneling through the tunnel oxide layer overlying the tunneling channel to occur across the entire portion of the tunneling channel, thereby increasing the EEPROM cell reliability. The EEPROM cell further has reduced thicknesses for the tunnel oxide layer and the program junction oxide layer to improve scaleablity and reduce operating voltages of the EEPROM cell of the present invention. This reduced oxide thickness lowers the voltages needed to operate an integrated circuit formed with cells 100e.

Further embodiments of the present invention use alternative types of programming elements, not based on tunneling of electrons, as illustrated in FIGS. 9–12.

In accordance with the present invention, FIGS. 9–12 show various embodiments of avalanche/Zener breakdown floating gate devices coupled in EEPROM cell structures which include accompanying control circuitry. The theory behind programming of floating gate devices is discussed extensively in copending application Ser. No. 09/226,702, inventors Steven J. Fong, Stewart G. Logie and Sunil D. Mehta, filed Jan. 7, 1999; Ser. No. 09/220,201 inventors Stewart G. Logie, Sunil D. Mehta and Steven J. Fong, filed Dec. 23, 1998; and Ser. No. 09/217,648, inventors Christopher O. Schmidt and Sunil D. Mehta, filed Dec. 21, 1998, each of which is specifically incorporated by reference.

Figure 9:
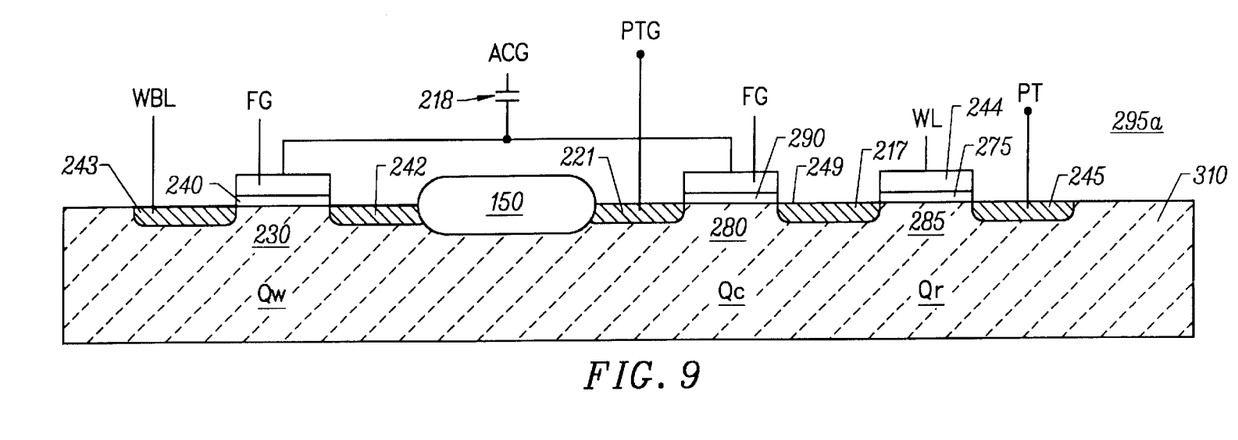
FIGS. 9–12 are semiconductor cross-sections of additional embodiments of EEPROM cells constructed in accordance with the present invention utilizing avalanche/Zener based breakdown programming elements.

A nonvolatile memory cell structure 295a shown in FIG. 9 formed in accordance with one aspect of the present invention includes a program junction (or an (array) control gate) ACG, floating gate FG, avalanche/Zener program element $Q_w$, a read transistor $Q_r$, and a sense transistor $Q_c$. The control gate ACG is used to accelerate electrons or holes selectively to or from the floating gate by capacitively coupling a field across the oxide that separates the avalanche element $Q_w$ from the floating gate FG. Floating gate FG is capacitively coupled to array control gate (ACG) voltage via capacitor 218. Avalanche/Zener program element $Q_w$ shares floating gate FG with sense transistor $Q_c$, and includes a first active region 242 and second active region 243.

It should be recognized that there are a number of possible configurations of the avalanche/Zener, element $Q_w$ only four of which are illustrated herein. However, such element can have a structure similar to that set forth in Ranaweera, et al., "performance Limitations of a Flash EEPROM Cell, Programmed With Zener Induced Hot Electrons," University of Toronto Department of Electrical Encineering (1997), and/or co-pending U.S. patent application Ser. No. 08/871,589 by Hao Fang, et al., filed Jul. 24, 1998 and assigned to the assignee of the present application, or those set forth in U.S. Pat. No. 4,491,657, or any number or alternative configurations.

In EEPROM cell 295, silicon substrate 310 has a first conductivity type such as a P-type conductivity. Avalanche/Zener element $Q_w$ has first impurity region 243 and a second impurity region 242, all formed within a substrate 310 with a channel 230f positioned therebetween. Overlying the channel 230f is an oxide layer 240f. The oxide layer 240f is typically composed of an insulating material, such as silicon dioxide, and has a thickness of approximately 80 to 150 angstroms. Oxide layer 240f may be deposited or grown (using convention al oxide deposition techniques) in a single process step.

Sense transistor $Q_c$ has an active region 221 and an active region 249 formed in the semiconductor substrate 310. A sense channel 280f is formed between region 221 and region 219. The conductivity of the region 221 and the region 249 is of, for example, an N+ conductivity type. Overlying the channel 280f is an oxide layer 290f having an approximate thickness of 80 angstroms. Depending on the mode of sense transistor $Q_c$ (depletion or enhancement mode), the relevant voltages for operating the EEPROM cell 295 are adjusted.

Floating gate FG overlies the program element oxide layer 240f and sense oxide layer 290f. Floating gate FG is also formed of a conducting material, such as a polycrystalline silicon material.

In FIG. 9 the ACG is represented schematically, but it will be understood that the ACG comprises a p-type impurity region formed in an n-well in the semiconductor substrate in accordance with the foregoing embodiments, and isolated from the corresponding program elements, and read and sense devices by device isolation regions.

FIG. 9 shows one embodiment of the programming element of the present invention wherein a single side of the element (e.g active region 243 coupled to the WBL) is utilizec for programming and erase. (A similar cell structure, utilizing an n-type program junction region is disclosed in co-pending U.S. patent application Ser. No. 09/217,648, inventors Christopher O. Schmidt and Sunil D. Mehta, hereby incorporated fully by reference.)

Figure 10:
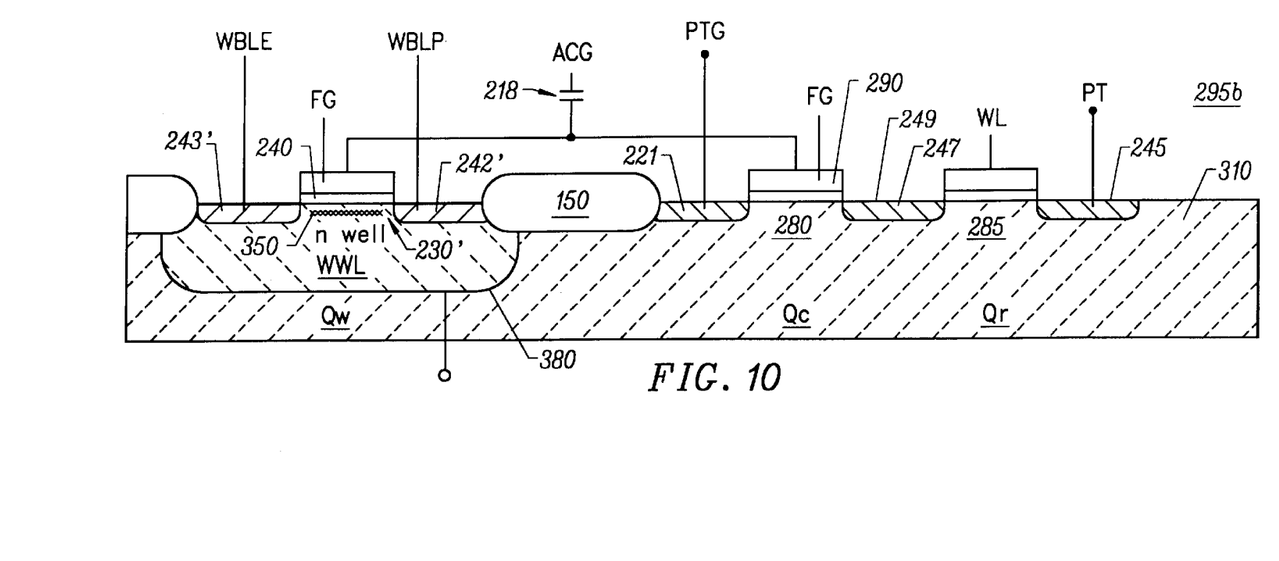

FIG. 10 is a cross section cf an alternative embodiment of the invention set forth above with respect to FIG. 9. In this embodiment, a dual side (program/erase) program transistor $Q_w'$ is utilized and is formed in an n well region 380 in substrate 310 in order to allow for easier coupling of devices in the array and provide an alternative mechanism for charging and discharging the floating gate FG. Since separate program and erase path are utilized, hence one active region is for example connected to a write enable line (WBL$_e$) while another active region is connected to the program enable line (WBL$_p$). It should be recognized that the separate program and erase paths shown in FIG. 10 are not required for the present invention, but the employment of this "back-to-back" diode provides advantages in separating the program and erase operations.

As shown in FIG. 10, well 380 has a second conductivity type opposite the first conductivity type, such as an N conductivity type. In contrast, the impurity regions 213' and 212' have the first conductivity type, e.g. a P type conductivity. An N+ region in well 380 provides appropriate electrical contact to metal lines in the EE-PROM cell 210, such as word write line (WWL).

Also illustrated in FIG. 10 is a selective channel implant region 350 implanted in channel 230' which allows one to tailor the reverse breakdown voltage of the cell to suit the particular application of the EEPROM 210.

Figure 12:
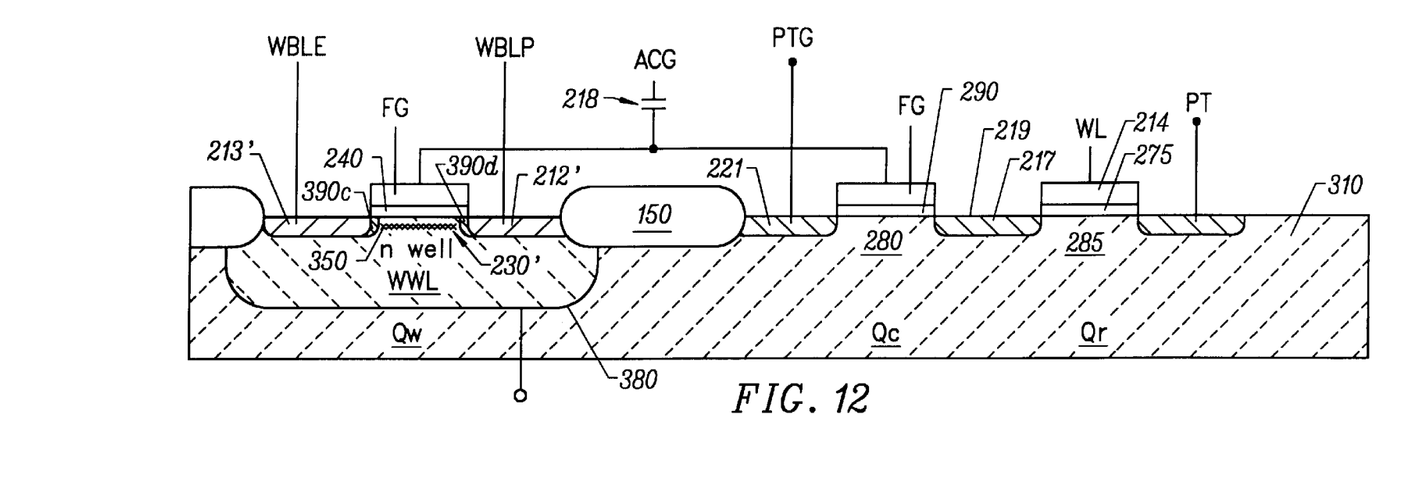

The elements $Q_w$, $Q_c$ and $Q_r$ of EEPROM 210 are electrically coupled to certain electrical lines and gates in order to operate and control the functions of the EEPROM cell 295. As shown in FIG. 12, WBL$_e$ is electrically coupled to the program region 243, WBL$_P$ coupled to region 242, and WWL to N+ well 380. Both configurations (95, 295') share the p-type program junction capacitor 218 of the present invention, used to capacitively couple voltage (ACG) onto the floating gate (FG). The array control gate (ACG) is capacitively coupled to the floating gate FG. A product term gate (PTG) is electrically coupled to the region 221 of the sense transistor $Q_c$. A word line read (WL) is electrically coupled to the read gate 244 of the read transistor $Q_r$ and a Product Term (PT) is electrically coupled to the read drain 245. A significant advantage of the N-well configuration shown in FIG. 10 is the isolation of element $Q_w$ with respect to other elements in an array of cells. Normally, tight control over programming voltages must be maintained in order to avoid program disturb. Isolation of each program element in an N-well reduces the need for this tight control due to the respective isolation of each cell.

Typical operating voltages for the foregoing lines are given in Table 2:

TABLE 2

|  | WBL | WWL | ACG | PT | PTG | WL |
|---|---|---|---|---|---|---|
| Erase (NMOS) | 6 v | 0 v | 8 v | Float | 6 v | $V_{cc}$ |
| Program (NMOS) | 6 v | 0 v | 0 v | Float | 0 v | 0 V |
| Erase (PMOS) | 0 v | 6 v | 8 v | Float | 6 v | $V_{cc}$ |
| Program (PMOS) | 0 v | 6 v | 0 v | Float | 0 v | 0 V |

It should be recognized that P-type doping of ACG can be independent of transistor doping, so that element $Q_w$' could also be formed in an NMOS embodiment, and element $Q_w$ in a PMOS embodiment, without diverging from the scope of the present invention. Moreover, numerous conventional fabrication methods are suitable for adjusting the diode doping gradient of the channel region 350.

Figure 11:
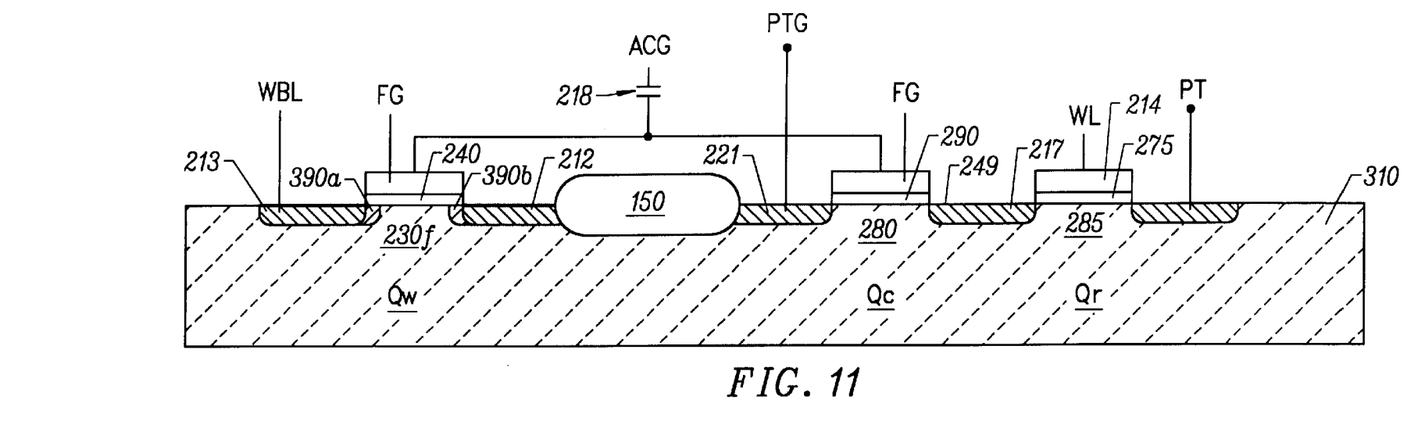

A still further embodiment of the present invention is show in FIGS. 11 and 12, which are structurally and operationally similar to the cell embodiments shown in FIGS. 9 and 10, respectively. In FIGS. 11 and 12, the active regions are provided with additonal, opposing conductivity type implant regions 390$_1$,390$_2$ and 390$_3$,390$_4$ to enhance and tailor the Zener breakdown characteristics of the respective junctions.

Each of the aforementioned embodiments utilizes a program junction (ACG) formed of a p-type impurity region in an n-well in the semiconductor substrate, and would benefit from the attendant advantages heretofore described.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit and scope of the invention as disclosed herein and defined by the following claims.

What is claimed is:

1. A nonvolatile memory device, comprising:
   a semiconductor substrate, said semiconductor substrate having a p-type conductivity,
   a program element;
   a program junction region formed in said semiconductor substrate, said program junction region separated from said program element by a field isolation region, said program junction region having said p-type conductivity;
   a program junction oxide layer overlying said program junction region; and
   a floating gate overlying said program element layer, and said program junction oxide layer.

2. The nonvolatile memory device of claim 1 wherein said substrate has an n-type conductivity.

3. The nonvolatile memory device of claim 1 wherein said substrate has a p-type conductivity and said program unction is formed in a well of n-type conductivity.

4. The nonvolatile memory device of claim 1 wherein said program element is a tunneling structure.

5. The nonvoltaile memory device of claim 4, wherein said program element is a transistor.

6. The nonvolatile memory device of claim 4 wherein said program element is formed of at least a first impurity region in the substrate, said first impurity region being coupled to the floating gate.

7. The nonvolatile memory device of claim 6 further including a sense transistor formed of a second and third impurity regions in the substrate, the sense transistor being coupled to at least a portion of the floating gate.

8. The nonvolatile memory device of claim 7 wherein said said second and third regions are n-type impurity regions.

9. The nonvolatile memory device of claim 7 wherein said second and third regions are p-type regions formed in an n-type impurity well in the substrate.

10. The nonvolatile memory device of claim 4 wherein said program element is formed of at least a first p-type impurity region in an n-well formed in the substrate, said first region being coupled to the floating gate.

11. The nonvolatile memory device of claim 10 further including a sense transistor formed of a third and forth impurity regions in the substrate, the sense transistor being coupled to at east a portion of the floating gate.

12. The nonvolatile memory device of claim 10 wherein said said third and fourth regions are n-type impurity regions.

13. The nonvolatile memory device of claim 10 wherein said third and fourth regions are p-type regions formed in an n-type impurity well in the substrate.

14. The nonvolatile memory device of claim 1 wherein said program junction region is formed of a boron impurity in said substrate.

15. The nonvolatile memory device of claim 1 wherein the program junction oxide has a thickness of about 75 Å to 90 Å.

16. The nonvolatile memory device of claim 1 wherein the active doping concentration of said program junction region is about $10^{18} cm^{-2}$ to $10^{20} cm^{-2}$.

17. The nonvolatile memory device of claim 1 further including a read transistor formed in and on said substrate.

18. The nonvolatile memory device of claim 1 wherein said program element is a reverse breakdown injection element at least partially formed in a first portion of a semiconductor substrate and under at least a portion of the floating gate.

19. The nonvolatile memory device of claim 18 wherein said reverse breakdown injection element comprises at least a first active region formed in the substrate, the first active region being coupled to the floating gate to supply electrons and holes during breakdown which can be selectively drawn onto the floating gate upon application of an appropriate voltage on the program junction.

20. The nonvolatile memory device of claim 19 wherein at least a first active region is formed of an n-type impurity region in the substrate.

21. The nonvolatile memory device of claim 19 wherein at least a first active region is formed of a p-type impurity region in an n-well in the substrate.

22. The nonvolatile memory device of claim 19 wherein the reverse breakdown injection element further includes a second active region separated from the first active region by a channel, and the first and second active regions are formed of an n-type impurity region in the substrate.

23. The nonvolatile memory device of claim 19 wherein the reverse breakdown injection element further includes a second active region separated from the first active region by a channel, and the first and second active regions are formed of a p-type impurity region in an n-well in the substrate.

24. The nonvolatile memory device of claim 19 wherein the reverse breakdown injection element further includes a second active region of opposite conductivity type adjacent to the first active region, and the first and second active regions are formed of an n-type impurity and p-type region, respectively, in the substrate.

25. The nonvolatile memory device of claim 19 wherein the reverse breakdown injection element further includes a second active region of oppositive conductivity type directly adjacent to the first active region, and the first and second active regions are formed of a p-type impurity and an n-type impurity, respectively.

26. The nonvolatile memory device of claim 25 wherein the reverse breakdown injection element is formed in an n-well.

27. An EEPROM cell, comprising:
a semiconductor substrate, said semiconductor substrate having a p conductivity type
a program element formed in said semiconductor substrate;
a well region of an n conductivity type formed in said substrate;
a program junction region formed in said well region, said program junction region separate from said program element by a field oxide region, said program junction region having said p conductivity type;
a program junction oxide layer overlying said program junction region;
a sense transistor formed in said semiconductor substrate;
a read transistor formed in said semiconductor substrate, said read transistor having a read source shared with the sense transistor and a read drain; and
a floating gate overlying said program junction oxide layer, at least a portion of said program element, and at least a portion of said sense transistor.

28. The EEPROM cell of claim 27, wherein said program element comprises a tunneling transistor, said tunneling transistor having a tunneling source, a tunneling drain and a channel between said tunneling source and said tunneling drain, said tunneling drain and said tunneling source having an n-type conductivity; and
a tunnel oxide layer overlying said channel, said tunneling source and said tunneling drain.

29. The EEPROM cell of claim 28, wherein said electron tunneling occurs through said tunnel oxide layer overlying said channel across an entire portion of said channel.

30. The EEPROM cell of claim 27 wherein said program element is a reverse breakdown injection element at least partially formed in a first portion of a semiconductor substrate and under at least a portion of the floating gate.

31. The EEPROM cell of claim 30 wherein said reverse breakdown injection element comprises at least a first active region formed in the substrate, the first active region being coupled to the floating gate to supply electrons and holes during breakdown which can be selectively drawn onto the floating gate upon application of an appropriate voltage on the program junction.

32. The EEPROM cell of claim 31 wherein the reverse breakdown injection element further includes a second active region separated from the first active region by a channel, and the first and second active regions are formed of an n-type impurity region in the substrate.

33. The EEPROM cell of claim 31 wherein the reverse breakdown injection element further includes a second active region separated from the first active region by a channel, and the first and second active regions are formed of an p-type impurity region n an n-well in the substrate.

34. The EEPROM cell of claim 31 wherein the reverse breakdown injection element further includes a second active region of opposite conductivity type adjacent to the first active region, and the first and second active regions are formed of an n-type impurity and p-type region, respectively, in the substrate.

35. The EEPROM cell of claim 31 wherein the reverse breakdown injection element further includes a second active region of oppositive conductivity type directly adjacent to the first active region, and the first and second active regions are formed of a p-type impurity and an n-type impurity, respectively.

36. A nonvolatile memory device comprising:
a semiconductor substrate of a p-type conductivity having a top surface;
a control region of the same conductivity type as that of said substrate formed on and below said surface of said substrate;
a source and drain region formed on and below said surface of said substrate, isolated from the control region,
a gate oxide layer formed over said control region; and
a floating gate formed over said control region and said program element, said floating gate being capacitively coupled to said control region via said gate oxide layer.

37. A nonvolatile memory device comprising:

a semi conductor substrate, said semiconductor substrate having a p-type conductivity;

means for programming and erasing said device;

a program junction region formed in said semiconductor substrate, said program junction region separated from said means for programming by a field isolation region, said program junction region having said p-type conductivity;

a program junction oxide layer overlying said program junction region;

a sense transistor having a sense channel region; and a floating gate overlying said programming device, said program junction oxide layer and said sense channel region.

* * * * *